(12) United States Patent
Chiu et al.

(10) Patent No.: US 12,080,614 B2
(45) Date of Patent: Sep. 3, 2024

(54) LIDDED SEMICONDUCTOR PACKAGE

(71) Applicant: MEDIATEK INC., Hsin-Chu (TW)

(72) Inventors: Shih-Chao Chiu, Hsinchu (TW); Chi-Yuan Chen, Hsinchu (TW); Wen-Sung Hsu, Hsinchu (TW); Ya-Jui Hsieh, Hsinchu (TW); Yao-Pang Hsu, Hsinchu (TW); Wen-Chun Huang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 379 days.

(21) Appl. No.: 17/493,853

(22) Filed: Oct. 5, 2021

(65) Prior Publication Data

US 2022/0130734 A1 Apr. 28, 2022

Related U.S. Application Data

(60) Provisional application No. 63/177,992, filed on Apr. 22, 2021, provisional application No. 63/105,377, filed on Oct. 26, 2020.

(51) Int. Cl.
| | |
|---|---|
| *H01L 23/31* | (2006.01) |
| *H01L 23/40* | (2006.01) |
| *H01L 23/473* | (2006.01) |
| *H05K 5/00* | (2006.01) |
| *H05K 5/02* | (2006.01) |
| *H05K 5/03* | (2006.01) |

(52) U.S. Cl.
CPC ......... *H01L 23/31* (2013.01); *H01L 23/4006* (2013.01); *H01L 23/473* (2013.01); *H05K 5/0052* (2013.01); *H05K 5/0221* (2013.01); *H05K 5/03* (2013.01)

(58) Field of Classification Search
CPC ..... H01L 23/4006; H05K 5/0052; H05K 5/03
See application file for complete search history.

(56) References Cited

U.S. PATENT DOCUMENTS

| | | | |
|---|---|---|---|
| 6,140,141 A | 10/2000 | Davidson | |
| 6,724,080 B1 | 4/2004 | Ooi | |
| 2001/0040288 A1* | 11/2001 | Matsushima | H01L 23/10 257/E23.193 |
| 2002/0187591 A1* | 12/2002 | Bai | H01L 24/29 29/841 |
| 2004/0084764 A1 | 5/2004 | Ishimine | |

(Continued)

FOREIGN PATENT DOCUMENTS

| | | |
|---|---|---|
| EP | 0 260 370 A2 | 3/1988 |
| EP | 0 260 370 A3 | 1/1989 |

(Continued)

*Primary Examiner* — Jay C Chang
*Assistant Examiner* — Mikka Liu
(74) *Attorney, Agent, or Firm* — Winston Hsu

(57) ABSTRACT

A semiconductor package includes a substrate having a top surface and a bottom surface; a semiconductor die mounted on the top surface of the substrate; and a two-part lid mounted on a perimeter of the top surface of the substrate and housing the semiconductor die. The lid comprises an annular lid base and a cover plate removably installed on the annular lid base. The semiconductor package can be uncovered by removing the cover plate and a forced cooling module can be installed in place of the cover plate.

20 Claims, 6 Drawing Sheets

(56) References Cited

U.S. PATENT DOCUMENTS

| | | | |
|---|---|---|---|
| 2004/0104468 A1* | 6/2004 | Suzuki | H01L 23/427 257/E23.098 |
| 2006/0137856 A1* | 6/2006 | Popovich | F28F 1/405 165/80.4 |
| 2007/0035937 A1* | 2/2007 | Colbert | H01L 23/4006 361/810 |
| 2009/0283902 A1 | 11/2009 | Bezama | |
| 2012/0098118 A1 | 4/2012 | Lin | |
| 2014/0284040 A1 | 9/2014 | Colgan | |
| 2017/0092619 A1 | 3/2017 | Refai-Ahmed | |

FOREIGN PATENT DOCUMENTS

| | | | |
|---|---|---|---|
| JP | 4-122054 A | | 4/1992 |
| JP | 09139451 A | * | 5/1997 |

* cited by examiner

LIDDED SEMICONDUCTOR PACKAGE

CROSS REFERENCE TO RELATED APPLICATIONS

This application claims priorities from U.S. provisional application No. 63/105,377 filed on Oct. 26, 2020 and U.S. provisional application No. 63/177,992 filed on Apr. 22, 2021, the disclosures of which are included in their entireties herein by reference.

BACKGROUND

The present disclosure relates generally to the field of semiconductor packaging. More particularly, the present disclosure relates to a lidded semiconductor package with good warpage and SMT control and enhanced thermal performance.

With ever-increasing integration of the integrated circuit (IC) devices driven by the demand for higher performance, IC devices at all levels of application have been incorporating more circuit elements per unit area. Demands for smaller package sizes and increased device densities have also resulted in higher power densities, with the concomitant need for efficient heat dissipation becoming extremely important.

Managing heat generated by the operating semiconductor chip has become an important technical issue. As temperature increases chip failure rates increase and heat may cause permanent damage to the semiconductor chip. Consequently, effective dissipation of heat becomes a crucial problem for semiconductor packages.

As power levels and heat generation increase in high-performance CPUs and other semiconductor devices, the thermal performance of commonly used packaging components is becoming a limiting factor. Many such devices are mounted in flip chip packages, in which the die is underfilled on the active side and in direct contact with a thermal interface material (also known as "TIM" or "TIM 1"), with a metal or ceramic lid attached on the opposite side. The lid serves as physical protection for the die as well as package stiffener, while the thermal interface material helps to dissipate excess heat. In some cases, a heat sink may be mounted on the lid with another TIM layer (also known as "TIM 2").

It is well known that connections between the ball grid array (BGA) device and the circuit board are made through contact pads placed on the underside of the chip package. A complementary contact pad array or landing area is located on a surface of the circuit board where the BGA device is to be positioned. Compared to the annular-type stiffener ring, the lidded semiconductor package provides better warpage and SMT control.

However, the thermal performance and heat-dissipating efficiency of the above-described configurations are still not satisfactory. With power levels steadily rising in new and emerging device designs, there is a constant need in this industry to provide improved thermal properties of semiconductor packages to ensure performance and reliability.

SUMMARY

One object of the present invention is to provide an improved lidded semiconductor package in order to solve the above-mentioned prior art problems or shortcomings.

One aspect of the invention provides a semiconductor package includes a substrate having a top surface and a bottom surface; a semiconductor die mounted on the top surface of the substrate; and a two-part lid mounted on a perimeter of the top surface of the substrate and housing the semiconductor die. The lid comprises an annular lid base and a cover plate removably installed on the annular lid base.

According to some embodiments, the semiconductor die is mounted on the top surface of the substrate in a flip-chip manner.

According to some embodiments, the semiconductor die has an active surface that faces downwardly to the substrate and connecting elements disposed on the active surface, wherein the connecting elements are bonded to respective pads disposed on the top surface of the substrate.

According to some embodiments, a gap between the semiconductor die and the substrate is filled with an underfill layer.

According to some embodiments, the lid is a meal lid.

According to some embodiments, the cover plate is affixed to the annular lid base with a fastening means.

According to some embodiments, the fastening means comprises a screw bolt, a magnet or a clamp.

According to some embodiments, the cover plate is engaged with the annular lid base through a groove.

According to some embodiments, the annular lid base comprises vertical walls spaced apart from the semiconductor die and an annular, horizontal inner flange inwardly protruding beyond the vertical walls, wherein the horizontal inner flange overlaps with a peripheral portion of the semiconductor die.

According to some embodiments, the horizontal inner flange is adhered to the peripheral portion of the semiconductor die with an adhesive layer, thereby hermetically sealing an annular cavity around the semiconductor die.

According to some embodiments, the inner flange defines a central opening that exposes a rear surface of the semiconductor die.

According to some embodiments, the cover plate comprises a central heat slug that is disposed within the central opening and is in direct contact with the rear surface of the semiconductor die.

According to some embodiments, the cover plate further comprises an outwardly protruding flange overlapping with the annular lid base.

According to some embodiments, the central heat slug is thicker than the outwardly protruding flange.

According to some embodiments, the annular lid base and the cover plate are made of stainless steel, aluminum, copper or alloys thereof.

According to some embodiments, the annular lid base and the cover plate are made of different materials.

Another aspect of the invention provides a printed circuit board assembly (PCBA) including a printed circuit board and a semiconductor package mounted on the printed circuit board. The semiconductor package includes a substrate having a top surface and a bottom surface, a semiconductor die mounted on the top surface of the substrate, and an annular lid base mounted on the a perimeter of the top surface of the substrate and around the semiconductor die. A forced cooling module is installed on the annular lid base and on the semiconductor die.

According to some embodiments, the forced cooling module is secured to the annular lid base by using a fastening means.

According to some embodiments, the fastening means comprises a screw bolt, a magnet, a clamp, or an adhesive.

According to some embodiments, the forced cooling module is in direct contact with a rear surface of the semiconductor die without using a thermal interface material therebetween.

According to some embodiments, the forced cooling module comprises a means for cooling down the semiconductor die.

According to some embodiments, the means for cooling comprises a fan or liquid coolant.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention and are incorporated in and constitute a part of this specification. The drawings illustrate embodiments of the invention and, together with the description, serve to explain the principles of the invention. In the drawings.

DETAILED DESCRIPTION

Figure 1:
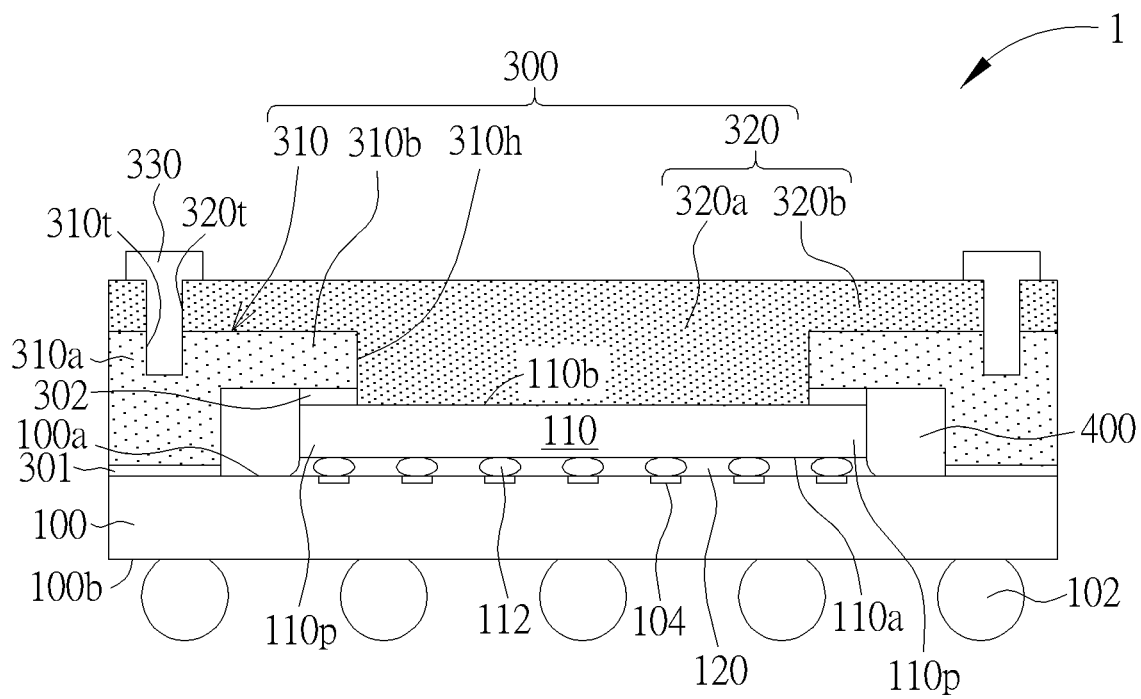
FIG. 1 is a schematic, cross-sectional diagram showing an exemplary lidded semiconductor package according to an embodiment of the invention.

In the following detailed description of embodiments of the invention, reference is made to the accompanying drawings, which form a part hereof, and in which is shown by way of illustration specific preferred embodiments in which the disclosure may be practiced.

These embodiments are described in sufficient detail to enable those skilled in the art to practice them, and it is to be understood that other embodiments may be utilized and that mechanical, chemical, electrical, and procedural changes may be made without departing from the spirit and scope of the present disclosure. The following detailed description is, therefore, not to be taken in a limiting sense, and the scope of embodiments of the present invention is defined only by the appended claims.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Packaging of an integrated circuit (IC) chip can involve attaching the IC chip to a substrate (e.g., a packaging substrate) which, among other things, provides mechanical support and electrical connections between the chip and other electronic components of a device. Substrate types include, for example, cored substrates, including thin core, thick core (laminate BT (bismaleimide-triazine resin) or FR-4 type fibrous board material), and laminate core, as well as coreless substrates. Cored package substrates, for example, can be built up layer by layer around a central core, with layers of conductive material (usually copper) separated by layers of insulating dielectric, with interlayer connections being formed with through holes or microvias (vias).

Thermal design and material selection continues to be a concern for electronic packages, particularly for flip chip ball grid array packages (FCBGA). Larger die sizes exhibit greater package warpage due to the difference in thermal expansion coefficients between silicon and laminate materials. As a result, large die packages are more difficult to solder mount and may produce larger variations in the bond line thickness between the die and external heat sinks.

The present disclosure pertains to a lidded semiconductor package having a two-part lid including a cover plate removably affixed to a lid base. After mounting the lidded semiconductor package onto a circuit board, the cover plate can be removed and replaced with a forced cooling system or module, which may be in direct contact with a surface of a die without the need of applying a thermal interface material at an interface therebetween. A conventional heat sink, which is usually mounted on the lid, can be spared.

FIG. 1 is a schematic, cross-sectional diagram showing an exemplary lidded semiconductor package according to an embodiment of the invention. As shown in FIG. 1, the lidded semiconductor package 1 comprises a substrate 100 such as a package substrate or an interposer substrate, but not limited thereto. For the sake of simplicity, the traces or interconnect structures in the substrate 100 are not shown. It is understood that the substrate 100 may comprise circuits, traces and/or interconnect structures for electrically connecting the semiconductor die 110 to an external circuit system such as a printed circuit board (PCB) or a system board.

According to one embodiment, solder balls 102 such as BGA balls are disposed on the bottom surface 100b of the substrate 100.

According to an embodiment of the invention, a semiconductor die 110 may be mounted on a top surface 100a of the substrate 100, for example, in a flip-chip manner. The semiconductor die 110 has an active surface 110a that faces downwardly to the substrate 100. Connecting elements 112 such as conductive bumps, micro bumps, pillars or the like may be provided on the active surface 110a. The connecting elements 112 are bonded to respective pads 104 disposed on the top surface 100a of the substrate 100.

A gap between the semiconductor die 110 and the substrate 100 may be filled with an underfill layer 120 comprising insulating material such as epoxy, but not limited thereto. For example, an underfill resin with a coefficient of thermal expansion (CTE) close to that of the connecting elements 112 may be deposited and cured in the gap between the semiconductor die 110 and substrate 100. The use of underfill resin enables structural coupling of the chip and substrate, effectively decreasing the shear stress and thus lowering the applied strain on the solder joints.

According to one embodiment, a lid 300 is secured onto a perimeter of the top surface 100a of the substrate 100 with an adhesive layer 301. According to one embodiment, the lid 300 may comprise stainless steel, aluminum, copper or an alloy thereof, but is not limited thereto. The semiconductor die 110 is housed by the lid 300. The lid 300 serves as physical protection for the semiconductor die 110 as well as package stiffener to alleviate package warpage during assembly process.

According to one embodiment, the lid 300 comprises an annular lid base 310 and a cover plate 320 affixed to the annular lid base 310 with a fastening means 330 such as a screw bolt, a magnet or a clamp. The annular lid base 310 comprises vertical walls 310a spaced apart from the semiconductor die 110 and horizontal inner flange 310b inwardly protruding beyond the vertical walls 310a and overlapping with a peripheral portion 110p of the semiconductor die 110. According to one embodiment, the horizontal inner flange 310b is adhered to the peripheral portion 110p of the semiconductor die 110 with an adhesive layer 302, thereby hermetically sealing an annular cavity 400 around the semiconductor die 110. According to one embodiment, the horizontal inner flange 310b also defines a central opening 310h that exposes a rear surface 110b of the semiconductor die 110.

According to one embodiment, the cover plate 320 comprises a central heat slug 320a that is disposed within the central opening 310h and is in direct contact with the rear surface 110b of the semiconductor die 110 without using an adhesive layer or a thermal interface material. An outwardly protruding flange 320b, which is integrally formed with the central heat slug 320a, overlaps with the annular lid base 310. According to one embodiment, the central heat slug 320a is thicker than the flange 320b. In some embodiments, an adhesive layer may be used between the central heat slug 320a and the rear surface 110b of the semiconductor die 110. According to one embodiment, screw holes 310t and 320t may be provided in the annular lid base 310 and the cover plate 320, respectively. According to one embodiment, for example, the annular lid base 310 and the cover plate 320 may be made of stainless steel, aluminum, copper or alloys thereof, but not limited thereto. According to one embodiment, the annular lid base 310 and the cover plate 320 may be made of different materials.

Figure 2:
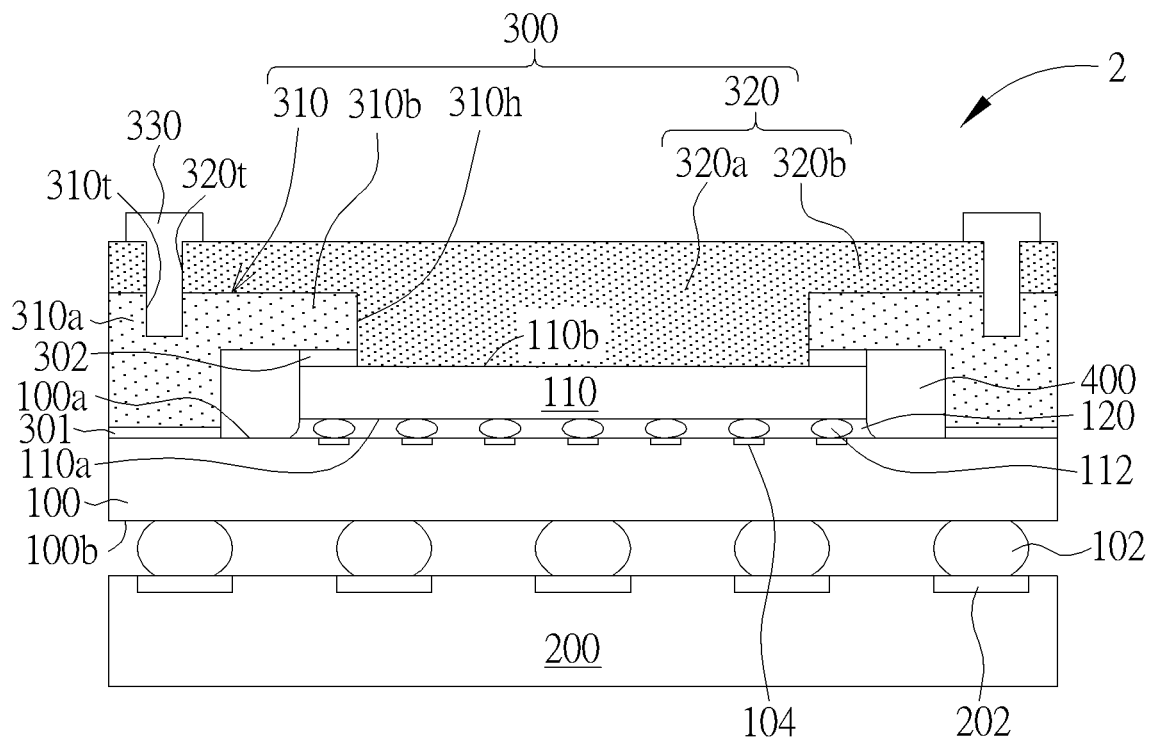
FIG. 2 is a schematic, cross-sectional diagram showing an exemplary printed circuit board assembly (PCBA) after the lidded semiconductor package in FIG. 1 is mounted onto a PCB according to an embodiment of the invention.

FIG. 2 is a schematic, cross-sectional diagram showing an exemplary printed circuit board assembly (PCBA) 2 after the lidded semiconductor package 1 in FIG. 1 is mounted onto a PCB according to an embodiment of the invention, wherein like regions, layers or elements are designated by like numeral numbers or labels. As shown in FIG. 2, the lidded semiconductor package 1 may be mounted onto the PCB 200 by using conventional surface mount technology (SMT). The solder balls 102 such as BGA balls are joined to respective land pads 202 on the PCB 200. To meet accuracy requirements, an auto-placement machine may be used to place lidded semiconductor package 1 on the PCB 200. A solder reflow process may be performed to form a uniform solder structure strongly bonded to both the PCB 200 and the lidded semiconductor package 1. The lid 300 ensures good warpage and SMT control when mounting the lidded semiconductor package 1 onto the PCB 200.

Figure 3:
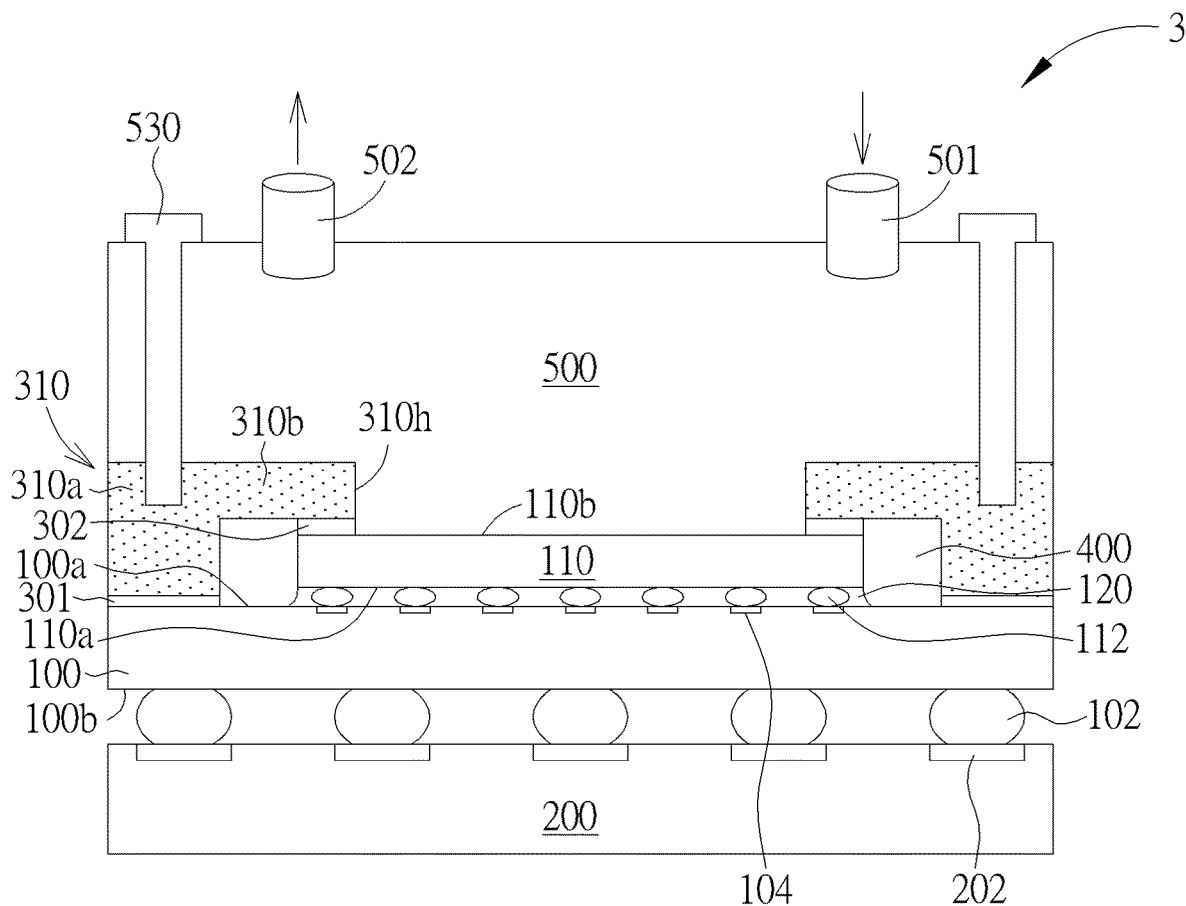
FIG. 3 is a schematic, cross-sectional diagram showing an exemplary PCBA after the cover plate in FIG. 2 is replaced with a forced cooling module according to an embodiment of the invention.

FIG. 3 is a schematic, cross-sectional diagram showing an exemplary PCBA 3 after the cover plate 320 in FIG. 2 is replaced with a forced cooling module according to an embodiment of the invention, wherein like regions, layers or elements are designated by like numeral numbers or labels. As shown in FIG. 3, after the lidded semiconductor package 1 is mounted onto the PCB 200, the cover plate 320 may be removed to expose the rear surface 110b of the semiconductor die 110 through the central opening 310h. A forced cooling module 500 may be installed on the annular lid base 310 and on the semiconductor die 110. The forced cooling module 500 may be secured to the annular lid base 310 by using a fastening means 530 such as a screw bolt, a magnet, a clamp, or an adhesive.

According to one embodiment, the forced cooling module 500 is in direct contact with the rear surface 110b of the semiconductor die 110 without using any thermal interface material therebetween. The forced cooling module 500 may comprise a means for cooling down the operating semiconductor die 110. For example, the means for cooling may comprise a fan or liquid coolant. According to one embodiment, the forced cooling module 500 may comprise a channel (not shown) that allows liquid coolant to flow therethrough. According to one embodiment, a liquid inlet 501 and a liquid outlet 502 may be provided on the forced cooling module 500. The liquid inlet 501 and the liquid outlet 502 communicate with the channel, and may be situated at distal ends of the channel, respectively. A conduit or pipe (not shown) with an end joint or an adaptor may be provided to connect with either the liquid inlet 501 or the liquid outlet 502 for flowing coolant in or out of the forced cooling module 500.

Figure 4:
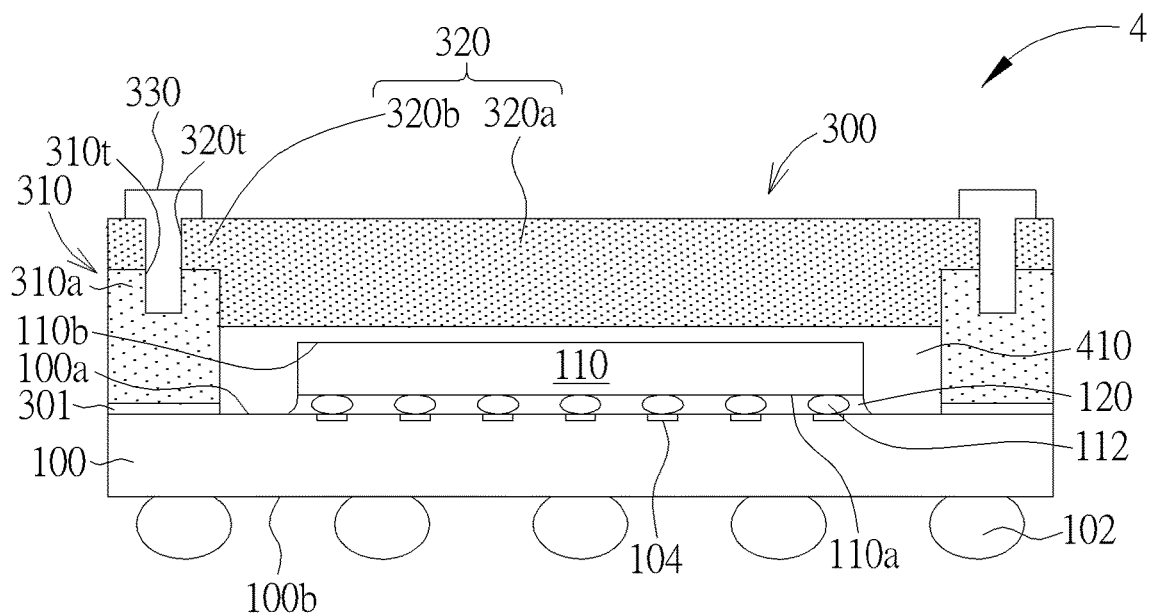
FIG. 4 is a schematic, cross-sectional diagram showing an exemplary lidded semiconductor package according to another embodiment of the invention.
Figure 5:
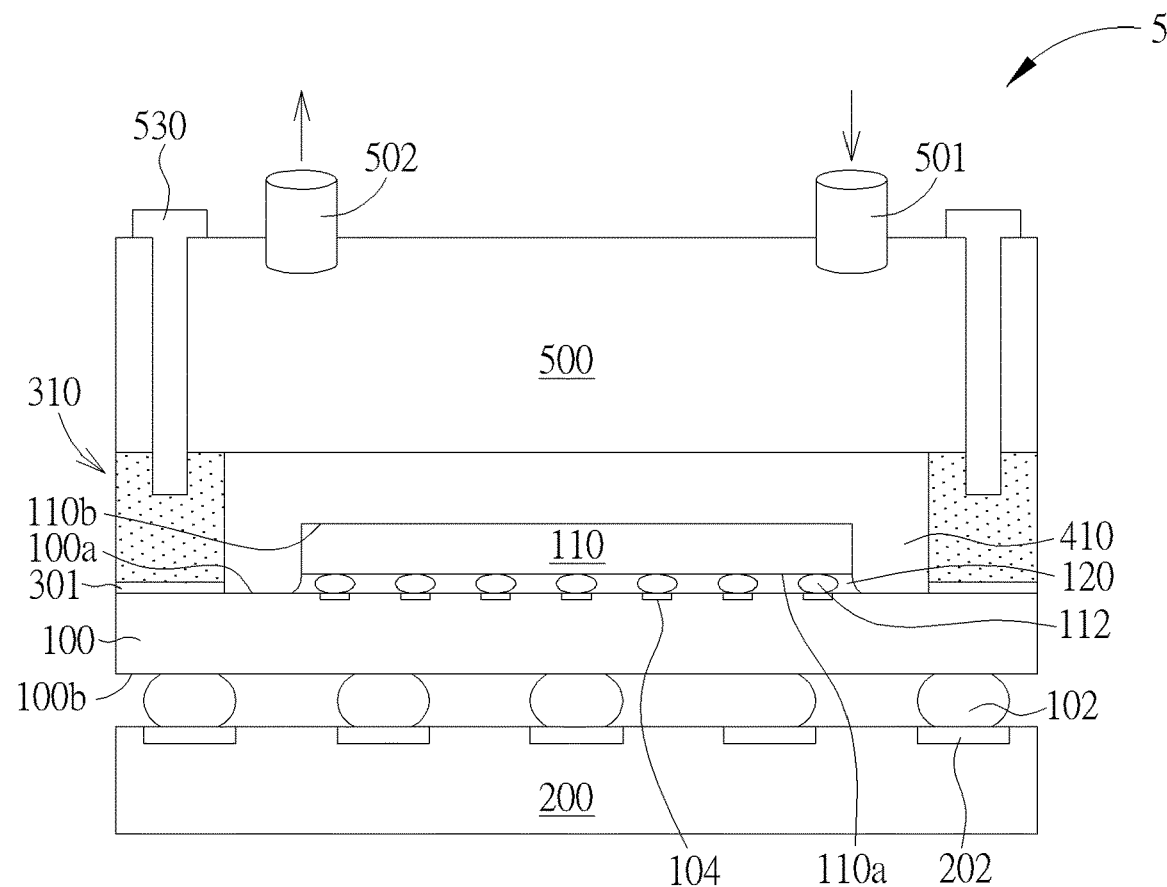
FIG. 5 is a schematic, cross-sectional diagram showing an exemplary PCBA after the cover plate in FIG. 4 is replaced with a forced cooling module according to another embodiment of the invention.

Please refer to FIG. 4 and FIG. 5. FIG. 4 is a schematic, cross-sectional diagram showing an exemplary lidded semiconductor package according to another embodiment of the invention. FIG. 5 is a schematic, cross-sectional diagram showing an exemplary PCBA 5 after the cover plate 320 in FIG. 4 is replaced with a forced cooling module according to another embodiment of the invention, wherein like regions, layers or elements are designated by like numeral numbers or labels.

As shown in FIG. 4, likewise, the lidded semiconductor package 4 comprises a substrate 100 such as a package substrate or an interposer substrate, but not limited thereto. For the sake of simplicity, the traces or interconnect structures in the substrate 100 are not shown. According to one embodiment, solder balls 102 such as BGA balls are disposed on the bottom surface 100b of the substrate 100.

According to an embodiment of the invention, a semiconductor die 110 may be mounted on a top surface 100a of the substrate 100, for example, in a flip-chip manner. The semiconductor die 110 has an active surface 110a that faces downwardly to the substrate 100. Connecting elements 112 such as conductive bumps, micro bumps, pillars or the like may be provided on the active surface 110a. The connecting elements 112 are bonded to respective pads 104 disposed on the top surface 100a of the substrate 100.

A gap between the semiconductor die 110 and the substrate 100 may be filled with an underfill layer 120 comprising insulating material such as epoxy, but not limited thereto. For example, an underfill resin with a coefficient of thermal expansion close to that of the connecting elements 112 may be deposited and cured in the gap between the semiconductor die 110 and substrate 100.

According to one embodiment, a lid 300 is secured onto a perimeter of the top surface 100a of the substrate 100 with an adhesive layer 301. According to one embodiment, the lid 300 may comprise stainless steel, aluminum, copper or an alloy thereof, but is not limited thereto. The semiconductor die 110 is housed by the lid 300. The lid 300 serves as physical protection for the semiconductor die 110 as well as package stiffener to alleviate package warpage during assembly process.

According to one embodiment, likewise, the lid 300 comprises an annular lid base 310 and a cover plate 320 removably mounted on the annular lid base 310. The cover plate 320 may be affixed on the annular lid base 310 with a fastening means 330 such as a screw bolt, a magnet or a clamp. The annular lid base 310 is composed of vertical walls 310a spaced apart from the semiconductor die 110, but does not comprise a horizontal inner flange inwardly protruding beyond the vertical walls 310a.

According to one embodiment, the cover plate 320 comprises a central heat slug 320a and an outwardly protruding flange 320b integrally formed with the central heat slug 320a. The outwardly protruding flange 320b overlaps with the annular lid base 310. According to one embodiment, screw holes 310t and 320t may be provided in the annular lid base 310 and the cover plate 320, respectively. According to one embodiment, for example, the annular lid base 310 and the cover plate 320 may be made of stainless steel, aluminum, copper or alloys thereof, but not limited thereto. According to one embodiment, the annular lid base 310 and the cover plate 320 may be made of different materials. According to one embodiment, the central heat slug 320a is spaced apart from the rear surface 110b of the semiconductor die 110. A cavity 410 is defined between the lid 300 and the rear surface 110b of the semiconductor die 110.

As shown in FIG. 5, after the lidded semiconductor package 4 is mounted onto the PCB 200, the cover plate 320 may be removed to expose the rear surface 110b of the semiconductor die 110. A forced cooling module 500 may be installed on the annular lid base 310 and over the semiconductor die 110. Likewise, the forced cooling module 500 may be secured to the annular lid base 310 by using a fastening means 530 such as a screw bolt, a magnet or a clamp.

According to one embodiment, the forced cooling module 500 is not in direct contact with the rear surface 110b of the semiconductor die 110. The forced cooling module 500 may comprise a means for cooling down the operating semiconductor die 110. For example, the means for cooling may comprise a fan or liquid coolant. According to one embodiment, the forced cooling module 500 may comprise a channel (not shown) that allows liquid coolant to flow therethrough. According to one embodiment, a liquid inlet 501 and a liquid outlet 502 may be provided on the forced cooling module 500. The liquid inlet 501 and the liquid outlet 502 communicate with the channel, and may be situated at distal ends of the channel, respectively.

Figure 6:
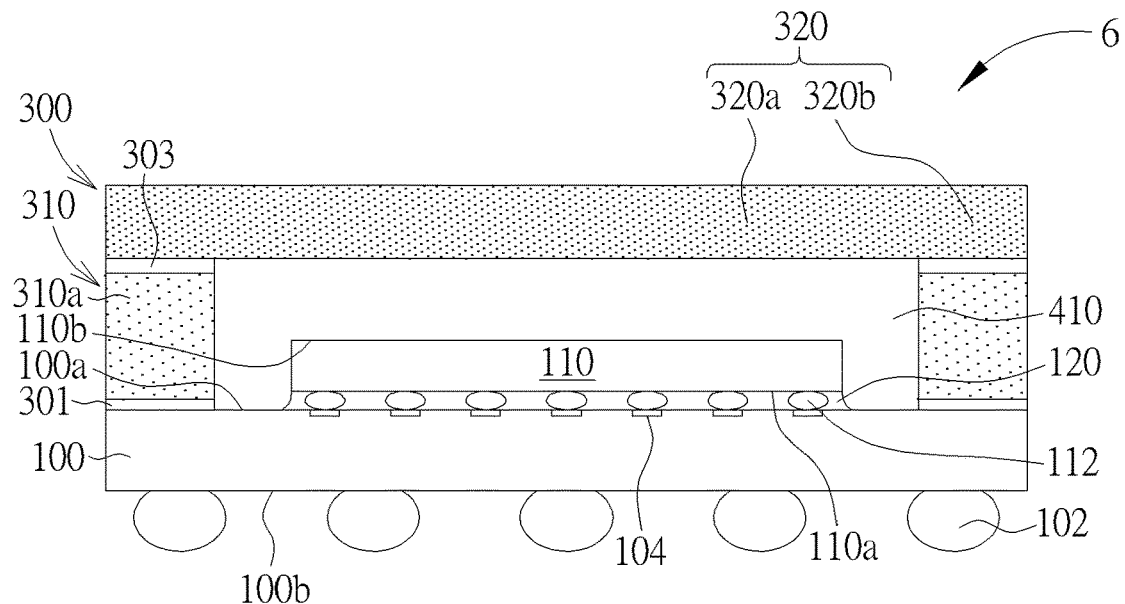
FIG. 6 is a schematic, cross-sectional diagram showing an exemplary lidded semiconductor package according to another embodiment of the invention.
Figure 7:
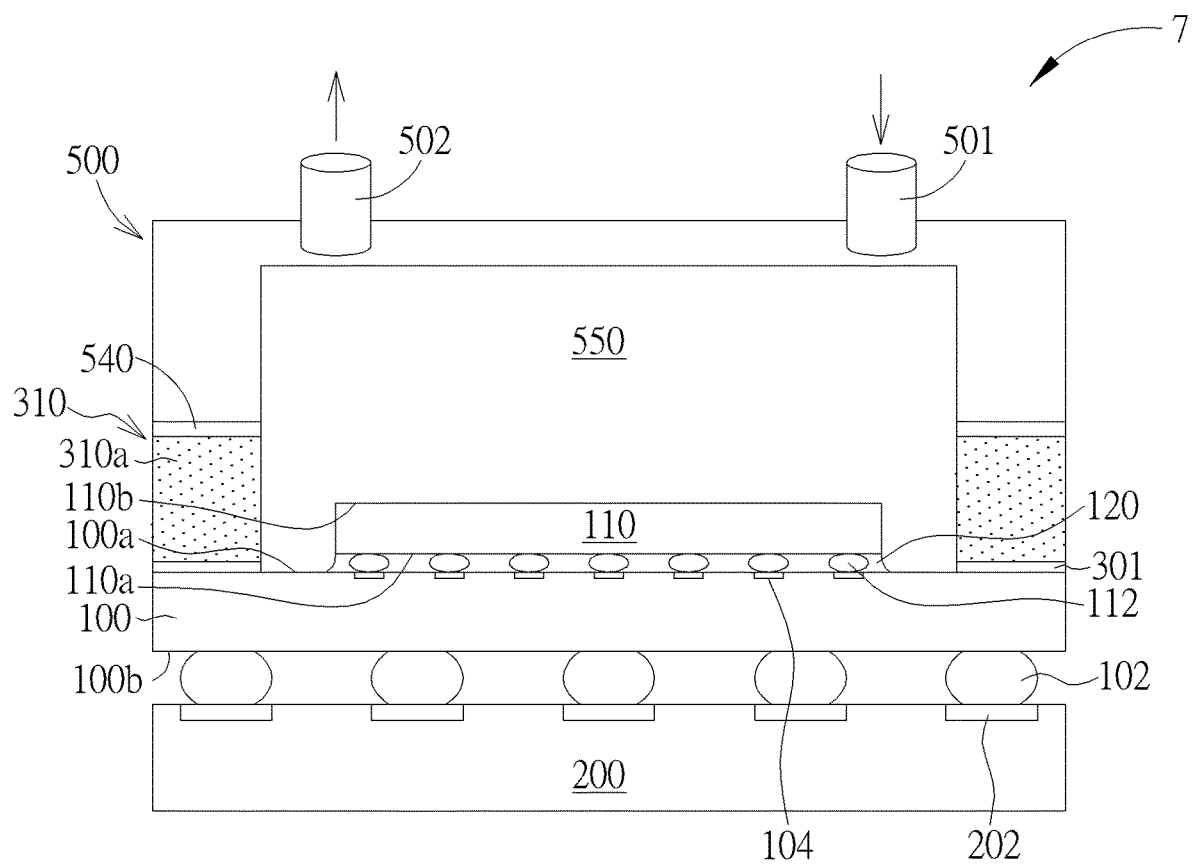
FIG. 7 is a schematic, cross-sectional diagram showing an exemplary PCBA after the cover plate in FIG. 6 is replaced with a forced cooling module according to another embodiment of the invention.

Please refer to FIG. 6 and FIG. 7. FIG. 6 is a schematic, cross-sectional diagram showing an exemplary lidded semiconductor package according to another embodiment of the invention. FIG. 7 is a schematic, cross-sectional diagram showing an exemplary PCBA 7 after the cover plate 320 in FIG. 6 is replaced with a forced cooling module according to another embodiment of the invention, wherein like regions, layers or elements are designated by like numeral numbers or labels.

As shown in FIG. 6, likewise, the lidded semiconductor package 6 comprises a substrate 100 such as a package substrate or an interposer substrate, but not limited thereto. For the sake of simplicity, the traces or interconnect structures in the substrate 100 are not shown. According to one embodiment, solder balls 102 such as BGA balls are disposed on the bottom surface 100b of the substrate 100.

According to an embodiment of the invention, a semiconductor die 110 may be mounted on a top surface 100a of the substrate 100, for example, in a flip-chip manner. The semiconductor die 110 has an active surface 110a that faces downwardly to the substrate 100. Connecting elements 112 such as conductive bumps, micro bumps, pillars or the like may be provided on the active surface 110a. The connecting elements 112 are bonded to respective pads 104 disposed on the top surface 100a of the substrate 100.

A gap between the semiconductor die 110 and the substrate 100 may be filled with an underfill layer 120 comprising insulating material such as epoxy, but not limited thereto. For example, an underfill resin with a coefficient of thermal expansion close to that of the connecting elements 112 may be deposited and cured in the gap between the semiconductor die 110 and substrate 100.

According to one embodiment, a lid 300 is secured onto a perimeter of the top surface 100a of the substrate 100 with an adhesive layer 301. According to one embodiment, the lid 300 may comprise stainless steel, aluminum, copper or an alloy thereof, but is not limited thereto. The semiconductor die 110 is housed by the lid 300. The lid 300 serves as physical protection for the semiconductor die 110 as well as package stiffener to alleviate package warpage during assembly process.

According to one embodiment, likewise, the lid 300 comprises an annular lid base 310 and a cover plate 320 removably mounted on the annular lid base 310. The cover plate 320 may be affixed on the annular lid base 310 with an adhesive layer 303. The annular lid base 310 is composed of vertical walls 310a spaced apart from the semiconductor die 110.

According to one embodiment, the cover plate 320 comprises a central heat slug 320a and an outwardly protruding flange 320b integrally formed with the central heat slug 320a. The outwardly protruding flange 320b overlaps with the annular lid base 310. The adhesive layer 303 is disposed between the outwardly protruding flange 320b and the annular lid base 310. According to one embodiment, for example, the annular lid base 310 and the cover plate 320 may be made of stainless steel, aluminum, copper or alloys thereof, but not limited thereto. According to one embodiment, the annular lid base 310 and the cover plate 320 may be made of different materials. According to one embodiment, the central heat slug 320a is spaced apart from the rear surface 110b of the semiconductor die 110. A cavity 410 is defined between the lid 300 and the rear surface 110b of the semiconductor die 110.

As shown in FIG. 7, after the lidded semiconductor package 6 is mounted onto the PCB 200, the cover plate 320 may be removed to expose the rear surface 110b of the semiconductor die 110. A forced cooling module 500 may be installed on the annular lid base 310 and over the semiconductor die 110. According to one embodiment, the forced cooling module 500 may be secured to the annular lid base 310 by using an adhesive layer 540.

According to one embodiment, the forced cooling module 500 may comprise a means for cooling down the operating semiconductor die 110. For example, the means for cooling may comprise a fan or liquid coolant. According to one embodiment, the forced cooling module 500 may comprise liquid coolant 550 contained in a chamber and the liquid coolant 550 is in direct contact with the semiconductor die 110. According to one embodiment, a liquid inlet 501 and a liquid outlet 502 may be provided on the forced cooling module 500. The liquid inlet 501 and the liquid outlet 502 communicate with the chamber.

Figure 8:
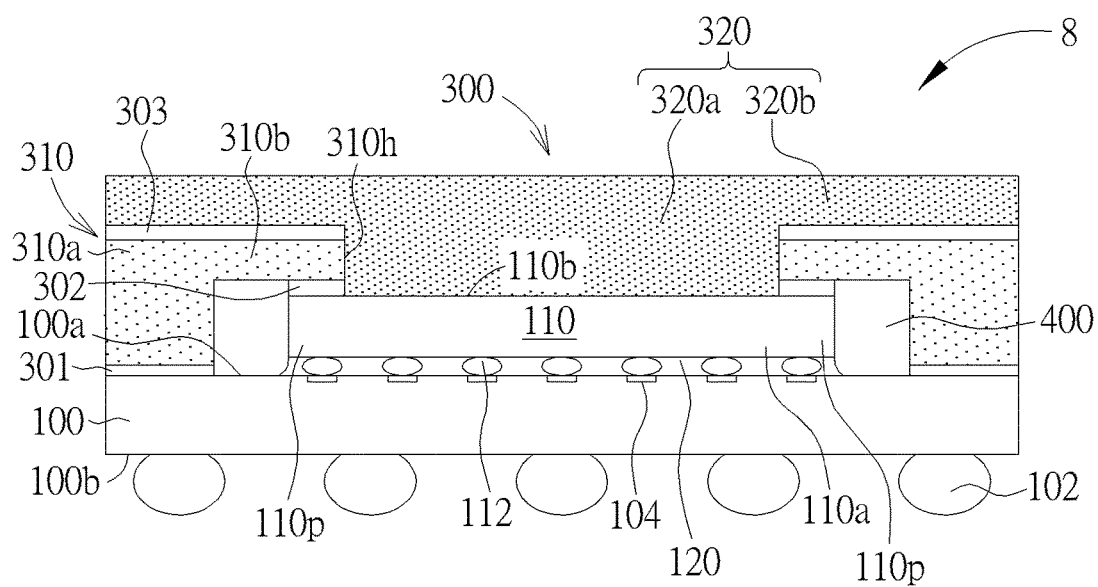
FIG. 8 is a schematic, cross-sectional diagram showing an exemplary lidded semiconductor package according to still another embodiment of the invention.
Figure 9:
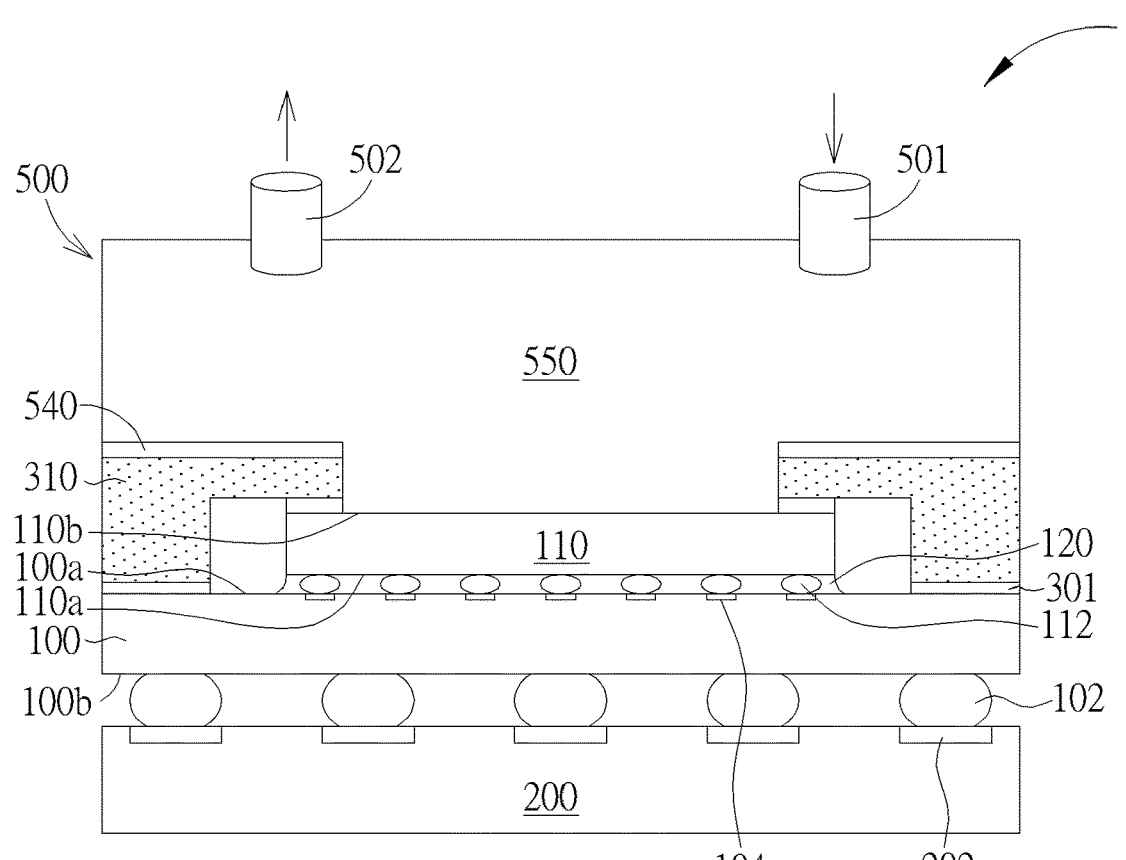
FIG. 9 is a schematic, cross-sectional diagram showing an exemplary PCBA after the cover plate in FIG. 8 is replaced with a forced cooling module according to another embodiment of the invention.

Please refer to FIG. 8 and FIG. 9. FIG. 8 is a schematic, cross-sectional diagram showing an exemplary lidded semiconductor package according to still another embodiment of the invention. FIG. 9 is a schematic, cross-sectional diagram showing an exemplary PCBA 9 after the cover plate 320 in FIG. 8 is replaced with a forced cooling module according to another embodiment of the invention, wherein like regions, layers or elements are designated by like numeral numbers or labels.

As shown in FIG. 8, the lidded semiconductor package 8 comprises a substrate 100 such as a package substrate or an interposer substrate, but not limited thereto. For the sake of simplicity, the traces or interconnect structures in the substrate 100 are not shown. It is understood that the substrate 100 may comprise circuits, traces and/or interconnect structures for electrically connecting the semiconductor die 110 to an external circuit system such as a PCB or a system board. According to one embodiment, solder balls 102 such as BGA balls are disposed on the bottom surface 100b of the substrate 100.

According to an embodiment of the invention, a semiconductor die 110 may be mounted on a top surface 100a of the substrate 100, for example, in a flip-chip manner. The semiconductor die 110 has an active surface 110a that faces downwardly to the substrate 100. Connecting elements 112 such as conductive bumps, micro bumps, pillars or the like may be provided on the active surface 110a. The connecting elements 112 are bonded to respective pads 104 disposed on the top surface 100a of the substrate 100.

A gap between the semiconductor die 110 and the substrate 100 may be filled with an underfill layer 120 comprising insulating material such as epoxy, but not limited thereto. For example, an underfill resin with a coefficient of thermal expansion close to that of the connecting elements 112 may be deposited and cured in the gap between the semiconductor die 110 and substrate 100.

According to one embodiment, a lid 300 is secured onto a perimeter of the top surface 100a of the substrate 100 with an adhesive layer 301. According to one embodiment, the lid 300 may comprise stainless steel, aluminum, copper or an alloy thereof, but is not limited thereto. The semiconductor die 110 is housed by the lid 300. The lid 300 serves as physical protection for the semiconductor die 110 as well as package stiffener to alleviate package warpage during assembly process.

According to one embodiment, the lid 300 comprises an annular lid base 310 and a cover plate 320 affixed to the annular lid base 310. The annular lid base 310 comprises vertical walls 310a spaced apart from the semiconductor die 110 and horizontal inner flange 310b inwardly protruding beyond the vertical walls 310a and overlapping with a peripheral portion 110p of the semiconductor die 110. According to one embodiment, the horizontal inner flange 310b is adhered to the peripheral portion 110p of the semiconductor die 110 with an adhesive layer 302 thereby hermetically sealing an annular cavity 400 around the semiconductor die 110. According to one embodiment, the horizontal inner flange 310b defines a central opening 310h that exposes a rear surface 110b of the semiconductor die 110.

According to one embodiment, the cover plate 320 comprises a central heat slug 320a that is disposed within the central opening 310h and is in direct contact with the rear surface 110b of the semiconductor die 110 without using an adhesive layer or a thermal interface material. An outwardly protruding flange 320b, which is integrally formed with the central heat slug 320a, overlaps with the annular lid base 310. According to one embodiment, the cover plate 320 may be adhered to the annular lid base 310 by using an adhesive layer 303. According to one embodiment, for example, the annular lid base 310 and the cover plate 320 may be made of stainless steel, aluminum, copper or alloys thereof, but not limited thereto. According to one embodiment, the annular lid base 310 and the cover plate 320 may be made of different materials.

As shown in FIG. 9, after the lidded semiconductor package 8 is mounted onto the PCB 200, the cover plate 320 may be removed to expose the rear surface 110b of the semiconductor die 110. A forced cooling module 500 may be installed on the annular lid base 310 and on the semiconductor die 110. According to one embodiment, the forced cooling module 500 may be secured to the annular lid base 310 by using an adhesive layer 540.

According to one embodiment, the forced cooling module 500 may comprise a means for cooling down the operating semiconductor die 110. For example, the means for cooling may comprise a fan or liquid coolant. According to one embodiment, the forced cooling module 500 may comprise liquid coolant that flows through a channel or the liquid coolant may be in direct contact with the semiconductor die 110. According to one embodiment, a liquid inlet 501 and a liquid outlet 502 may be provided on the forced cooling module 500.

Figure 10:
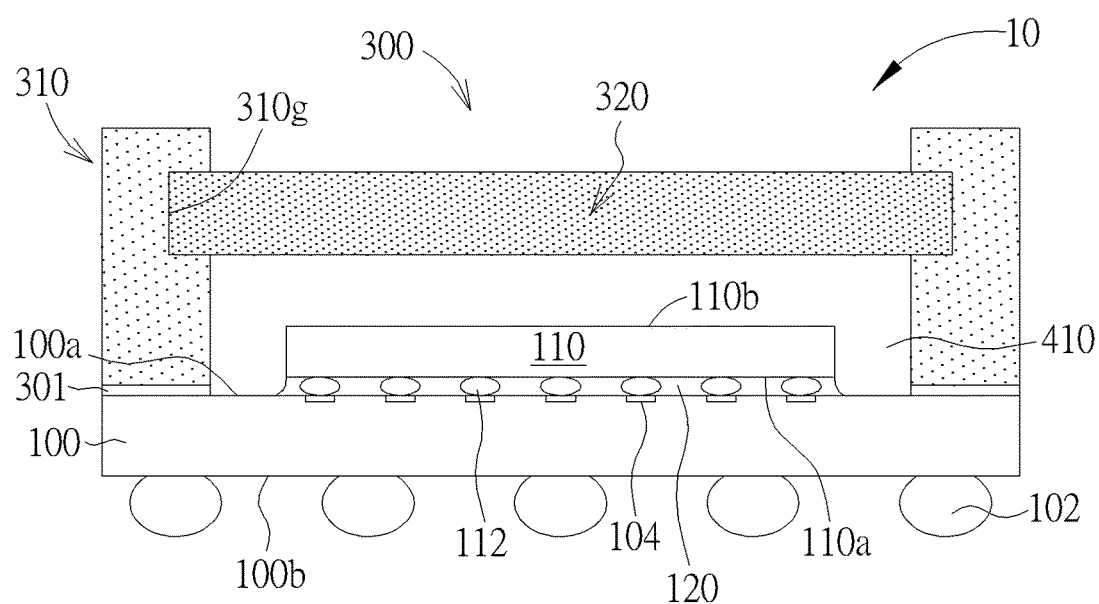
FIG. 10 is a schematic, cross-sectional diagram showing an exemplary lidded semiconductor package according to still another embodiment of the invention.
Figure 11:
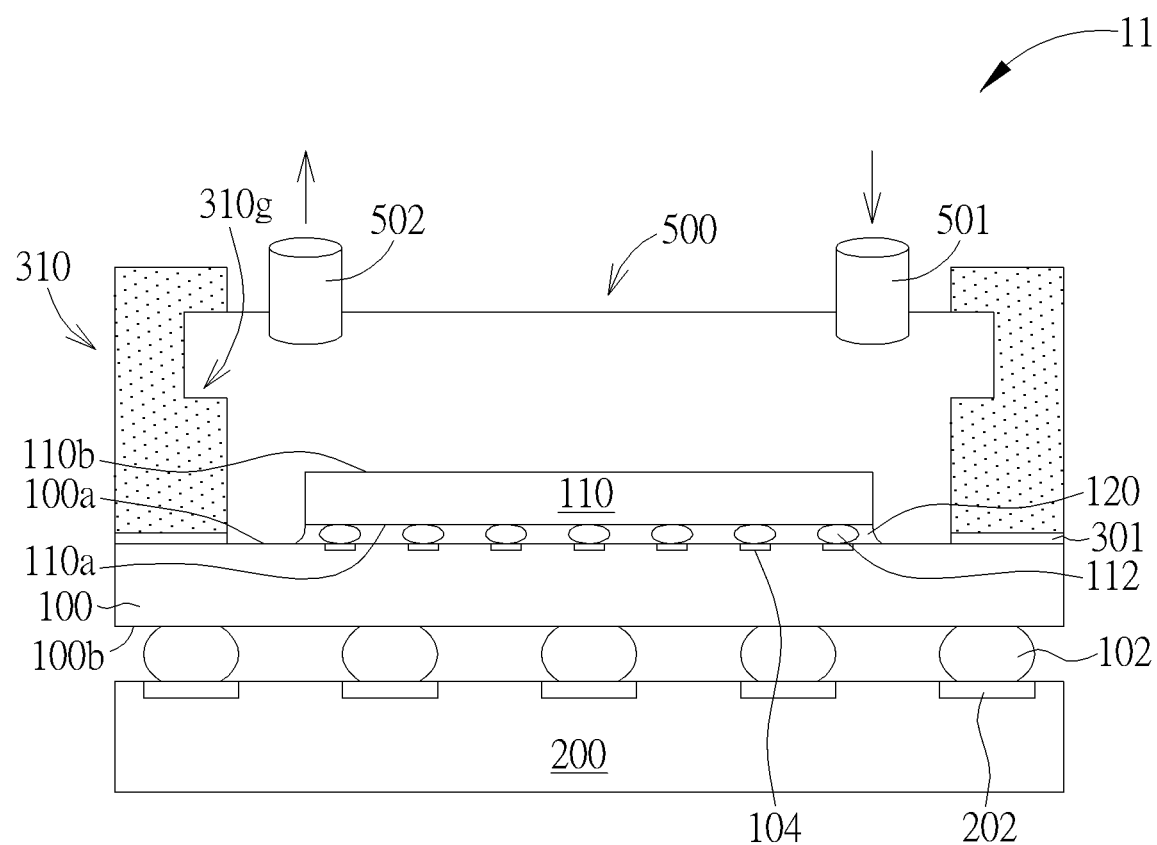
FIG. 11 is a schematic, cross-sectional diagram showing an exemplary PCBA after the cover plate in FIG. 10 is replaced with a forced cooling module according to another embodiment of the invention.

Please refer to FIG. 10 and FIG. 11. FIG. 10 is a schematic, cross-sectional diagram showing an exemplary lidded semiconductor package according to still another embodiment of the invention. FIG. 11 is a schematic, cross-sectional diagram showing an exemplary PCBA 10 after the cover plate 320 in FIG. 10 is replaced with a forced cooling module according to another embodiment of the invention, wherein like regions, layers or elements are designated by like numeral numbers or labels.

As shown in FIG. 10, the lidded semiconductor package 10 comprises a substrate 100 such as a package substrate or an interposer substrate, but not limited thereto. For the sake of simplicity, the traces or interconnect structures in the substrate 100 are not shown. According to one embodiment, solder balls 102 such as BGA balls are disposed on the bottom surface 100b of the substrate 100.

According to an embodiment of the invention, a semiconductor die 110 may be mounted on a top surface 100a of the substrate 100, for example, in a flip-chip manner. The semiconductor die 110 has an active surface 110a that faces downwardly to the substrate 100. Connecting elements 112 such as conductive bumps, micro bumps, pillars or the like may be provided on the active surface 110a. The connecting elements 112 are bonded to respective pads 104 disposed on the top surface 100a of the substrate 100.

A gap between the semiconductor die 110 and the substrate 100 may be filled with an underfill layer 120 comprising insulating material such as epoxy, but not limited thereto. For example, an underfill resin with a coefficient of thermal expansion close to that of the connecting elements 112 may be deposited and cured in the gap between the semiconductor die 110 and substrate 100.

According to one embodiment, a lid 300 is secured onto a perimeter of the top surface 100a of the substrate 100 with an adhesive layer 301. According to one embodiment, the lid 300 may comprise stainless steel, aluminum, copper or an alloy thereof, but is not limited thereto. The semiconductor die 110 is housed by the lid 300. The lid 300 serves as physical protection for the semiconductor die 110 as well as package stiffener to alleviate package warpage during assembly process.

According to one embodiment, likewise, the lid 300 comprises an annular lid base 310 and a cover plate 320 removably engaged with the annular lid base 310. The cover plate 320 may be installed through a groove 310g of the annular lid base 310. The annular lid base 310 is composed of vertical walls 310a spaced apart from the semiconductor die 110. According to one embodiment, for example, the annular lid base 310 and the cover plate 320 may be made of stainless steel, aluminum, copper or alloys thereof, but not limited thereto. According to one embodiment, the annular lid base 310 and the cover plate 320 may be made of different materials. According to one embodiment, the cover plate 320 is spaced apart from the rear surface 110b of the semiconductor die 110. A cavity 410 is defined between the lid 300 and the semiconductor die 110.

As shown in FIG. 11, after the lidded semiconductor package 10 is mounted onto the PCB 200, the cover plate 320 may be removed to expose the rear surface 110b of the semiconductor die 110. A forced cooling module 500 may be installed on the annular lid base 310 and on the semiconductor die 110. According to one embodiment, the forced cooling module 500 may be engaged with the annular lid base 310 through the groove 310g.

According to one embodiment, the forced cooling module 500 may comprise a means for cooling down the operating semiconductor die 110. For example, the means for cooling may comprise a fan or liquid coolant. According to one embodiment, the forced cooling module 500 may comprise liquid coolant that flows through a channel or the liquid coolant may be in direct contact with the semiconductor die 110. According to one embodiment, a liquid inlet 501 and a liquid outlet 502 may be provided on the forced cooling module 500.

It is advantageous to use the present invention because when assembling the lidded semiconductor package onto the PCB, the lid ensures good warpage control, thereby enhancing the reliability of the SMT process. After the SMT process, the cover plate of the lid or a part of the cover plate can be replaced with a forced cooling system module to improve the thermal performance of the semiconductor die and the PCBA.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor package, comprising:
a substrate having a top surface and a bottom surface;
a semiconductor die mounted on the top surface of the substrate; and
a two-part lid mounted on a perimeter of the top surface of the substrate and housing the semiconductor die, wherein the lid comprises an annular lid base and a cover plate removably installed on the annular lid base, wherein the annular lid base comprises vertical walls spaced apart from the semiconductor die and an annular, horizontal inner flange inwardly protruding beyond the vertical walls, wherein the horizontal inner flange overlaps with a peripheral portion of the semiconductor die.

2. The semiconductor package according to claim 1, wherein the semiconductor die is mounted on the top surface of the substrate in a flip-chip manner.

3. The semiconductor package according to claim 2, wherein the semiconductor die has an active surface that faces downwardly to the substrate and connecting elements disposed on the active surface, wherein the connecting elements are bonded to respective pads disposed on the top surface of the substrate.

4. The semiconductor package according to claim 2, wherein a gap between the semiconductor die and the substrate is filled with an underfill layer.

5. The semiconductor package according to claim 1, wherein the lid is a meal lid.

6. The semiconductor package according to claim 1, wherein the cover plate is affixed to the annular lid base with a fastening means.

7. The semiconductor package according to claim 6, wherein the fastening means comprises a screw bolt, a magnet or a clamp.

8. The semiconductor package according to claim 1, wherein the cover plate is engaged with the annular lid base through a groove.

9. The semiconductor package according to claim 1, wherein the horizontal inner flange is adhered to the peripheral portion of the semiconductor die with an adhesive layer, thereby hermetically sealing an annular cavity around the semiconductor die.

10. The semiconductor package according to claim 1, wherein the inner flange defines a central opening that exposes a rear surface of the semiconductor die.

11. The semiconductor package according to claim 10, wherein the cover plate comprises a central heat slug that is disposed within the central opening and is in direct contact with the rear surface of the semiconductor die.

12. The semiconductor package according to claim 11, wherein the cover plate further comprises an outwardly protruding flange overlapping with the annular lid base.

13. The semiconductor package according to claim 12, wherein the central heat slug is thicker than the outwardly protruding flange.

14. The semiconductor package according to claim 1, wherein the annular lid base and the cover plate are made of stainless steel, aluminum, copper or alloys thereof.

15. The semiconductor package according to claim 1, wherein the annular lid base and the cover plate are made of different materials.

16. A printed circuit board assembly, comprising:
a printed circuit board;
a semiconductor package mounted on the printed circuit board, the semiconductor package comprising: a substrate having a top surface and a bottom surface; a semiconductor die mounted on the top surface of the substrate; and an annular lid base mounted on the a perimeter of the top surface of the substrate and around the semiconductor die; and a forced cooling module installed on the annular lid base and on the semiconductor die, wherein the forced cooling module is in direct contact with a rear surface of the semiconductor die without using a thermal interface material therebetween.

17. The printed circuit board assembly according to claim 16, wherein the forced cooling module is secured to the annular lid base by using a fastening means.

18. The printed circuit board assembly according to claim 17, wherein the fastening means comprises a screw bolt, a magnet, a clamp, or an adhesive.

19. The printed circuit board assembly according to claim 16, wherein the forced cooling module comprises a means for cooling down the semiconductor die.

20. The printed circuit board assembly according to claim 19, wherein the means for cooling comprises a fan or liquid coolant.

* * * * *